United States Patent
Lin

(10) Patent No.: US 9,070,430 B2
(45) Date of Patent: Jun. 30, 2015

(54) DATA SAMPLING DEVICES

(75) Inventor: Chuan Lin, Beijing (CN)

(73) Assignee: Wuxi Vimicro Corporation, Jiangsu (CN)

( * ) Notice: Subject to any disclaimer, the term of this patent is extended or adjusted under 35 U.S.C. 154(b) by 901 days.

(21) Appl. No.: 13/230,783

(22) Filed: Sep. 12, 2011

(65) Prior Publication Data

US 2012/0327736 A1    Dec. 27, 2012

Related U.S. Application Data

(63) Continuation of application No. PCT/CN2010/073895, filed on Jun. 12, 2010.

(51) Int. Cl.
*G06F 13/12* (2006.01)
*G06F 13/38* (2006.01)
*G11C 7/10* (2006.01)

(52) U.S. Cl.
CPC ............ *G11C 7/1075* (2013.01); *G11C 7/1051* (2013.01); *G11C 7/1066* (2013.01)

(58) Field of Classification Search
None
See application file for complete search history.

(56) References Cited

U.S. PATENT DOCUMENTS

| 8,315,114 | B2* | 11/2012 | Lin | 365/193 |
| 2012/0173798 | A1* | 7/2012 | Kuan et al. | 711/103 |
| 2012/0239961 | A1* | 9/2012 | Makwana et al. | 713/401 |
| 2012/0243351 | A1* | 9/2012 | Ota | 365/193 |
| 2013/0176809 | A1* | 7/2013 | Swoboda | 365/233.13 |
| 2013/0194007 | A1* | 8/2013 | Nakamura | 327/113 |

* cited by examiner

*Primary Examiner* — Elias Mamo
(74) *Attorney, Agent, or Firm* — Joe Zheng

(57) ABSTRACT

Designs of a sampling controller working with memory chips are described. The designs enable a memory chip to work in high frequency clocks, resulting in high data throughput rate. A data sampling device includes a memory chip and a sampling controller. The sampling controller includes an asynchronous data memory. A data writing port of the asynchronous data memory receives a clock signal and employs the clock signal as a writing clock to store the sampling data into an internal memory and activate a data reading port thereof to read and output the sampling data.

18 Claims, 3 Drawing Sheets

DATA SAMPLING DEVICES

CROSS-REFERENCE TO RELATED APPLICATION

This application is a continuation application of International Application No. PCT/CN2010/073895, filed Jun. 12, 2010.

BACKGROUND OF THE INVENTION

1. Field of the Invention

The invention relates to the area of semiconductor integrated circuits, particularly to a data sampling device for a memory device, and a sampling controller.

2. Description of Related Art

A memory is an essential part of a processor, its main function is to provide a storage space for data, e.g., programs, original data, interim results, and operation results for the processor. The memory either functions as an area in which the processor runs programs, or communicates with external devices in coordination with the processor. Thus, the memory is required to possess features of high capacity, high speed, and high reliability.

A high speed memory transmits data both at the rising edge and the falling edge of a clock period. That is, the memory works twice during one clock cycle. As the effective time length for each sample of data is very short at high frequency clock, the memory requires a sampling circuit to be synchronized with high accuracy. The performance of the sampling circuit may dictate the reliability of the memory. Accordingly, the design of a sampling circuit for high frequency clock hence high transmission rate of data becomes an essential part in memory designs.

FIG. 1 shows a conventional sampling device of a memory chip. The sampling device of the memory carries out data sampling in a synchronized manner. The sampling device includes a sampling controller and a memory chip. The sampling controller includes three tri-state gate units PMEMIO, PMEMIO1 and PMEMIO2, and two register units DQ_S1 and DQ_S2. The tri-state gate unit PMEMIO includes three ports I, C and PAD. Signals are inputted to the port I of the tri-state gate unit PMEMIO and then outputted from the port PAD of the tri-state gate unit PMEMIO. The tri-state gate unit PMEMIO1 includes three ports I1, C1, and PAD1. Signals are inputted to the port PAD1 of the tri-state gate unit PMEMIO1 and outputted from the port C1 of the tri-state gate unit PMEMIO1. The tri-state gate unit PMEMIO2 includes three ports I2, C2, and PAD2. Signals are inputted to the port PAD2 of the tri-state gate unit PMEMIO2 and outputted from the port C2 of the tri-state gate unit PMEMIO2. The memory chip includes an input port CK for a clock signal, a data output port DQN, and an output port DQS for a sampling clock signal.

After being inverted in phase by a controller, a clock DCLK is provided to the port I of the tri-state gate unit PMEMIO and outputted from the port PAD, and then functions as an operational clock signal to the memory chip. The data output port DQN outputs data, typically experiencing a signal delay. The data is provided to the tri-state gate unit via the port PAD1 of the tri-state gate unit PMEMIO1 and then provided to the register unit DQ_S1 via the port C1. Meanwhile, a sampling clock signal from the DQS is provided to the tri-state gate unit via the port PAD2 of the tri-state gate unit PMEMIO2 and then outputted to a clock port CK1 of the register unit DQ_S1 from the port C2. The sampling controller samples the data coming into the register unit DQ_S1 and saves effective data in one clock cycle to the register unit DQ_S1. Meanwhile, the sampling controller supplies the clock DCLK to a sampling clock port CK2 of the register unit DQ_S2 and employs the clock DCLK as the sampling clock of the register unit DQ_S2 to sample data recorded in the register unit DQ_S1 and synchronize the sampled data with the clock of the register unit DQ_S2. As such, the data sampling in synchronized manner is finished.

It can be perceived from the above described operation that delay of the memory chip and read-write delay of the input/output port of the controller could cause a phase difference between the register unit DQ_S1 and the register unit DQ_S2. Thus, the synchronous data sampling device needs to pre-estimate the potential maximum delay and then calculate the phase difference based on the delay. In this way, the clock signals of the register unit DQ_S1 and the register unit DQ_S2 are synchronized according to the phase difference so as to ensure the accuracy of the data sampling. However, temperature variation and external electromagnetic interference may enlarge the read-write delays of the memory chip as well as the input/output port of the controller, the factual phase difference between the clock signals of the register unit DQ_S1 and the register unit DQ_S2 may be also enlarged. If the factual phase difference is greater than the pre-estimated phase difference, the register unit DQ_S2 would not properly read the effective data from the register unit DQ_S1, thus mishandling the sampling and decreasing the reliability of the sampling device of the memory.

SUMMARY OF THE INVENTION

One of the technical problems to be solved in the present invention is to provide a data sampling design which can properly sample data in high speed from a memory chip so as to improve the reliability and the utility of a sampling device.

Generally speaking, the present invention is related to memory designs. In particular, the present invention discloses a memory sampling device including a memory chip and a sampling controller. The memory chip includes a data output port and a sampling clock output port and the sampling controller includes a first input unit receiving sampling data from the data output port of the memory chip. A second input unit receives a clock signal from the sampling clock output port of the memory chip, an asynchronous data memory includes a memory data writing port, a memory data reading port, and an internal memory, where the memory data writing port receives the clock signal and employs the clock signal as a writing clock signal to store the sampling data of the first input unit into the internal memory. When the sampling data is stored to the internal memory, the memory data reading port reads the sampling data from the internal memory.

Preferably, the memory data writing port includes a writing clock input port receiving a clock signal from the second input unit and employing the clock signal as a writing clock, a writing control input port receiving a writing control signal, and a writing data input port storing the sampling data of the first input unit into the internal memory according to the writing clock and the writing control signal.

Preferably, the memory data reading port includes a reading clock input port receiving a reading clock signal, a reading control input port receiving a reading control signal, and a reading data output port reading the sampling data from the internal memory according to the reading clock signal and the reading control signal when the internal memory has new sampling data stored therein.

Preferably, the writing data input port includes a writing operation counter, a count value of the writing operation counter is increased by one when the sampling data is stored to the internal memory; the reading data output port including a reading operation counter, a count value of the reading operation counter is increased by one when the reading data output port reads the sampling data from the internal memory; the memory data reading port further including an internal memory state output port for output a state signal denoting that the internal memory stores new sampling data when the counter value of the writing operation counter is not equal to that of the reading operation counter; the state signal functioning as a reading control signal after being inverted to activate the reading data output port to read the sampling data from the internal memory.

The present invention also discloses a sampling controller for reading sampling data from a memory chip, the sampling controller comprises a first input unit configured for receiving a sampling data from the memory chip, a second input unit configured for receiving a clock signal from the memory chip, an asynchronous data memory including a memory data writing port, a memory data reading port, and an internal memory; the memory data writing port receiving the clock signal and employing the clock signal as a writing clock signal to store the sampling data of the first input unit into the internal memory; when the sampling data is stored to the internal memory, the memory data reading port reads the sampling data from the internal memory.

Compared with prior arts, the invention possesses following advantages. Firstly, the invention provides a data sampling device. The sampling controller of the data sampling device stores the sampling data outputted by the memory chip to the internal memory of the asynchronous data memory. When the sampling data is stored to the internal memory of the asynchronous data memory, the memory data reading port reads the sampling data from the internal memory. Because of that the memory data reading port reads the sampling data and outputs the data only when the internal memory has new sampling data stored therein, the data sampling operation can be properly finished in time. Secondly, during the operation of the device, the writing clock of the asynchronous data memory correlates to the sampling clock of the memory chip. The writing clock does not correlate with the reading clock. The processes storing new sampling data and reading the sampling data in the internal memory of the asynchronous data memory are mutually independent. The phase relationship of the clocks is negligible. The delay in the operation of the present embodiment is not sensitive, which differ from the delay in the conventional process, even though the delay is the main reason that causes a phase difference of the clocks. A tolerable delay bound of the signals may comparatively large. Thus, the present device can properly finish the data sampling process in time under a temperature variation or an electromagnetic interference.

BRIEF DESCRIPTION OF THE DRAWINGS

These and other features, aspects, and advantages of the present invention will become better understood with regard to the following description, appended claims, and accompanying drawings where:

DETAILED EMBODIMENTS

The detailed description of the present invention is presented largely according to drawings and preferred embodiments to explain objections, features, and advantages of the present invention. The present invention provides a data sampling device which synchronizes sampling data from an external clock domain to an internal clock domain, thereby properly performing the data sampling.

Figure 1:
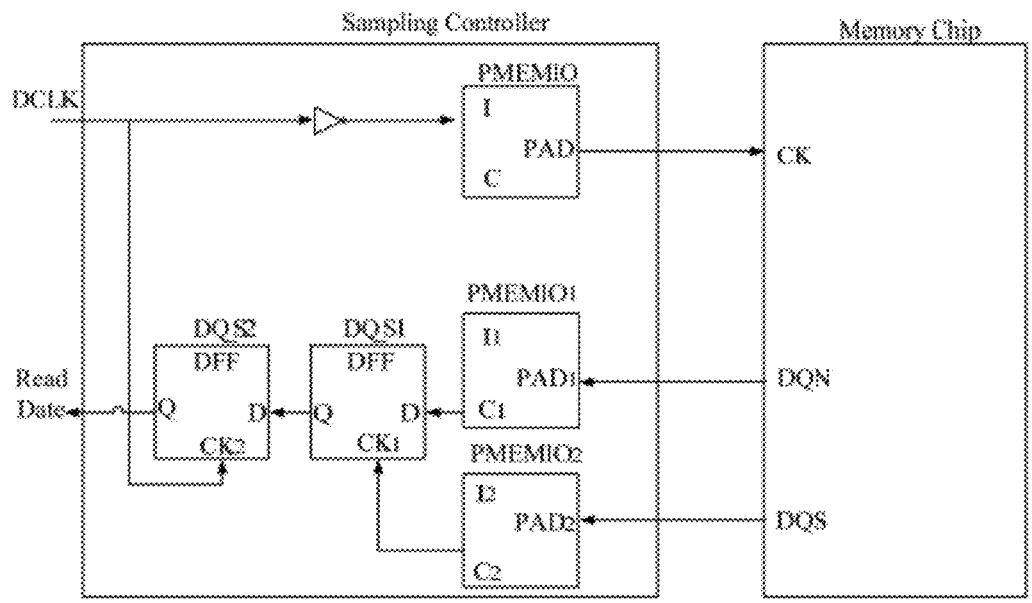
FIG. 1 is a schematic diagram of a conventional sampling device.
Figure 2:
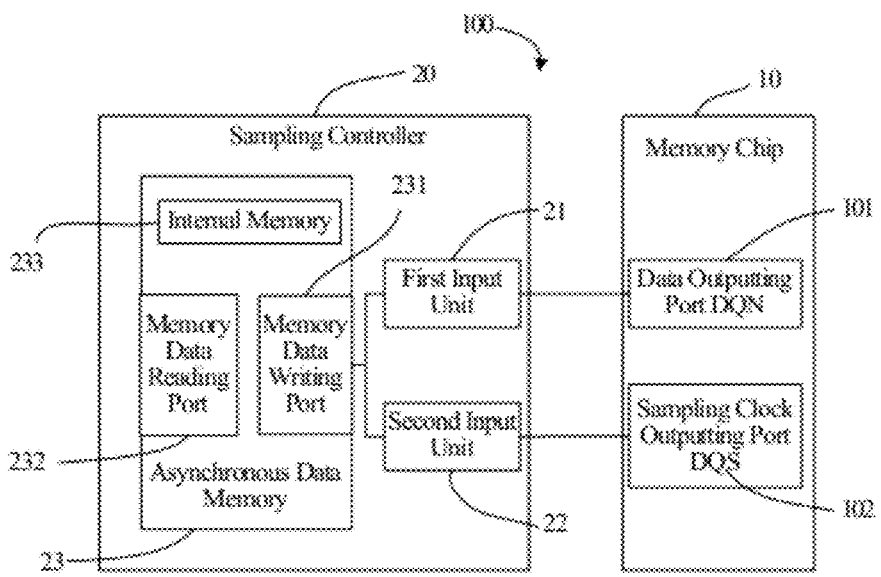
FIG. 2a schematic diagram of a data sampling device of a memory in a first embodiment of the invention.

Referring now to FIG. 2, it shows an exemplary data sampling device 100 according to a first embodiment. The device 100 includes a memory chip 10 and a sampling controller 20. The memory chip 10 includes a data output port DQN 101 for output sampling data from the memory chip 10 and a sampling clock output port DQS 102 for output a sampling clock signal. The sampling controller 20 includes a first input unit 21 for receiving the sampling data from the data output port DQN 101, and a second input unit 22 for receiving the clock signal from the sampling clock output port DQS 102, and an asynchronous data memory 23. The asynchronous data memory 23 includes a memory data writing port 231, a memory data reading port 232, and an internal memory 233. The memory data writing port 231 receives the clock signal, employs the clock signal as its writing clock signal, and stores the sampling data of the first input unit 21 into the internal memory 233 according to the writing clock signal. The memory data reading port 232 reads the sampling data from the internal memory 233 after the sampling data is stored into the internal memory 233.

The data output port DQN 101 is connected to the first input unit 21 of the sampling controller 20. The sampling clock output port DQS 102 of the memory chip 10 is coupled to the second input unit 22 of the sampling controller 20. The first input unit 21 and the second input unit 22 of the sampling controller 20 are both coupled to the memory data writing port 231.

The sampling data is outputted from the data output port DQN 101 of the memory chip 10, then inputted to the memory data writing port 231 through the first input unit 21, and subsequently accepted as an input data signal of the asynchronous data memory 23. The sampling clock signal is outputted from the sampling clock output port DQS 102, then inputted to the memory data writing port 231 through the second input unit 22, and functions as a writing clock signal for driving the memory data writing port 231 to store the input data signal into the internal memory 233 of the asynchronous data memory 23. When new data is written into the internal memory 233, the internal memory 233 outputs a controlling signal, which actuates the memory data reading port 232 to read the sampling data from the internal memory 233 and output the sampling data through an output port (not shown) of the asynchronous data memory 23. Thus, the sampling controller 20 reads the data outputted by the memory chip 10 with great accuracy and finishes the data sampling smoothly.

The operation of the above mentioned device is carried out in an asynchronous manner. The asynchronous mechanism in one embodiment works in the following description. When new data is written into the internal memory 233 of the asynchronous data memory 23, the internal memory 233 outputs a controlling signal for actuating the memory data reading port 232 to read the sampling data from the internal memory 233 and output the sampling data. The device timely reads the sampling data in manner of the above mentioned asynchronous mechanisms with great accuracy, thereby completing the data sampling operation of the memory chip.

Figure 3:
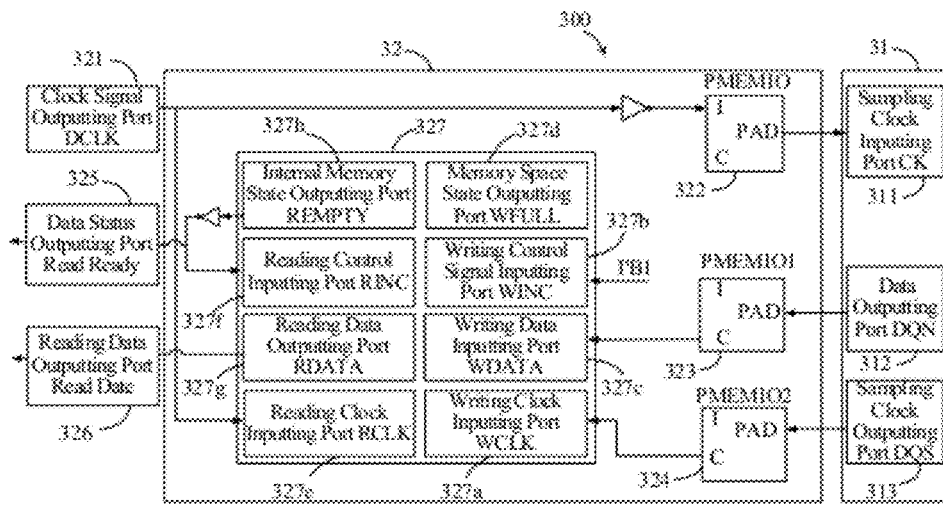
FIG. 3 is a schematic diagram of a DDR data sampling device in a second embodiment of the invention.

Referring to FIG. 3, it is a DDR data sampling device 300 according to a second embodiment of the present invention. The DDR data sampling device 300 uses a DDR SDRAM (Double Date Rate Synchronous Dynamic Random Access Memory). The DDR data sampling device 300 includes a DDR chip 31 and a DDR controller 32.

The DDR chip 31 includes a sampling clock input port CK 311, a data output port DQN 312, and a sampling clock output port DQS 313. The sampling clock input port CK 311 is configured for receiving a clock, which is used as a working clock of the DDR chip 31, from outside of the DDR chip 31. The data output port DQN 312 is configured for output the sampling data in the DDR chip 31. The sampling clock output port DQS 313 is configured for output a sampling clock signal of the DDR chip 31.

The DDR controller 32 includes a clock signal input port DCLK 321, a clock signal output unit PMEMIO 322, a first input unit PMEMIO1 323, a second input unit PMEMIO2 324, a data status output port Read Ready 325, a reading data output port Read Data 326, and an asynchronous data memory 327.

The clock signal input port DCLK 321 receives a clock signals outside of the DDR controller 32, which may be used as a working clock of the DDR controller 32. The clock signal output unit PMEMIO 322, the first input unit PMEMIO1 323, and the second input unit PMEMIO2 324 are tri-state gates. Each tri-state gate includes a port I, a port C, and a port PAD. The clock signal output unit PMEMIO 322 is configured for output the working clock of the DDR controller 32. After being inverted in phase, the working clock of the DDR controller 32 is inputted to the tri-state gate through the port I of the clock signal output unit PMEMIO 322 and then outputted from the port PAD. The first input unit PMEMIO1 323 is configured to receive sampling data from the data output port DQN 312. The sampling data is inputted through the port PAD of the first input unit PMEMIO1 323. The second input unit PMEMIO2 324 is configured to receive a sampling clock signal from the sampling clock output port DQS 313. The sampling clock signal is inputted through the port PAD of the second input unit PMEMIO2 324. The data status output port Read Ready 325 is configured for output a data status signal. When the data status signal outputted by data status output port Read Ready 325 is "1", the data status signal denotes that new sampling data reserved in the DDR controller 32 is desired to be read. When the data status signal outputted by data status output port Read Ready 325 is "0", the data status signal denotes that no new sampling data in the DDR controller 32 should be read. The reading data output port Read Data 326 is configured for output the sampling data from the DDR controller 32. The asynchronous data memory 327 includes an asynchronous data writing port (not marked), an asynchronous data reading port (not marked), and an asynchronous internal memory (not shown).

The asynchronous data memory 327 may be an asynchronous FIFO (First In First Out, FIFO for short) memory. The asynchronous data writing port includes a writing clock input port WCLK 327a, a writing control signal input port WINC 327b, a writing data input port WDATA 327c, a memory space state output port WFULL 327d, a reading clock input port RCLK 327e, and a reading control input port RINC 327f. The writing clock input port WCLK 327a is configured for receiving a clock signal from the second input unit PMEMIO2 324, which is used as a writing clock. The writing control signal input port WINC 327b is configured for receiving a writing control signal. The writing control signal may be always held in a high level. The writing data input port WDATA 327c is configured for storing the sampling data from the first input unit PMEMIO1 323 into the internal memory according to the writing clock and the writing control signal, and adding one to a count value of a corresponding writing operation counter. The memory space state output port WFULL 327d is configured for output a signal denoting the state of the memory space.

The device in present embodiment may include a plurality of internal memories, which may avoid insufficiency in the memory space. The reading clock input port RCLK 327e is configured for receiving a reading clock. The reading clock input port RCLK 327e can employ the working clock of the DDR controller 32 as the reading clock. The reading control input port RINC 327f is configured for receiving a reading control signal.

The asynchronous data reading port includes a reading data output port RDATA 327g and an internal memory state output port REMPTY 327h. When new sampling data is written into the internal memory, the reading data output port RDATA 327g reads the sampling data from the internal memory, then outputs the sampling data, and adds one to a count value of a corresponding reading operation counter, according to the reading clock and the reading control signal. The internal memory state output port REMPTY 327h outputs a signal "1" denoting that no new sampling data is written into the internal memory, if the counter value of the reading operation counter is equal to that of the writing operation counter. The internal memory state output port REMPTY 327h outputs a signal "0" denoting that there is new sampling data written into the internal memory, if the counter value of the reading operation counter is not equal to that of the writing operation counter. After being phase inverted, the signal outputted by the internal memory state output port REMPTY 327h is inputted into the reading control input port RINC 327f and used as the reading control signal.

Figure 4:
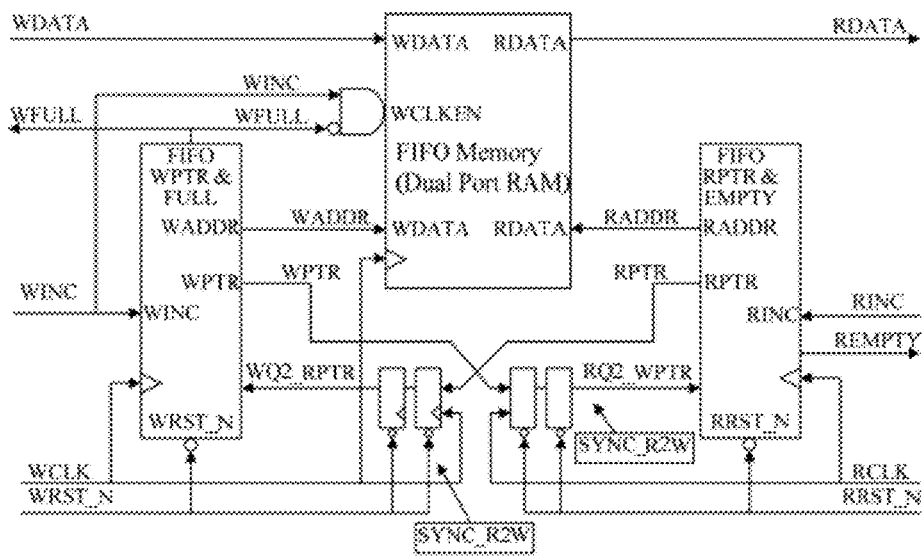
FIG. 4 is a schematic diagram of an asynchronous data memory in a second embodiment of the invention.

The asynchronous data memory 327 employs a sophisticated asynchronous clock module. Also referring to FIG. 4, WCLK is the writing clock input port. WDATA is the writing data input port. WINC is the writing control signal input port. WFULL is the memory space state output port. RCLK is the reading clock input port. RDATA is the reading data output port. REMPTY is the internal memory state output port. The above ports are respectively corresponding to the ports shown in FIG. 3. WRST_N is an asynchronous reset of WCLK. RRST_N is an asynchronous reset of RCLK.

The clock signal input port DCLK 321 is connected to the port I of the clock signal output unit PMEMIO 322 via a logic NOT gate. The port PAD of the clock signal output unit PMEMIO 322 is connected to the sampling clock input port CK 311 of the DDR chip 31. The data output port DQN 312 of the DDR chip 31 is connected to the port PAD of the first input unit PMEMIO1 323. The sampling clock output port DQS 313 of the DDR chip 31 is connected to the port PAD of the second input unit PMEMIO2 324. The port C of the first input unit PMEMIO1 323 is connected to the writing data input port WDATA 327c of the asynchronous data memory 327. The port C of the second input unit PMEMIO2 324 is connected to the writing clock input port WCLK 327a of the asynchronous data memory 327. The internal memory state output port REMPTY 327h is respectively connected to the data status output port Read Ready 325 and the reading control input port RINC 327f via a logic NOT gate. The reading data output port RDATA 327g is connected to the reading data output port READ DATA 326.

Figure 5:
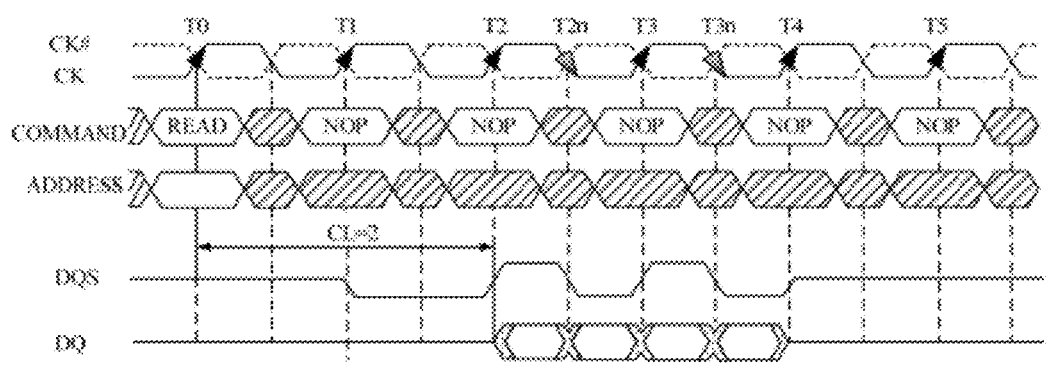
FIG. 5 is a time sequence chart of operation of a DDR chip under action of a DDR controller.

The operation of the DDR chip 31 under action of the DDR controller 32 can be illustrated by a following time sequence chart. Referring to FIG. 5, CK signifies the sampling clock input port 311. The wave corresponding to CK signifies a wave of the clock signal. COMMAND signifies a port of the DDR controller 32, which transmits commands to the DDR chip 31. The wave corresponding to COMMAND signifies a wave of the command signal. ADDRESS signifies a port of the DDR controller 32, which transmits addresses to the DDR chip 31. The wave corresponding to ADDRESS signifies a wave of the address signal. DQ signifies the data output port 312. The wave corresponding to DQ signifies a wave of the sampling data signal. DQS signifies the sampling clock output port 313 of the DDR chip 31. The wave corresponding to DQS signifies a wave of the sampling clock signal.

At the time T0, the DDR controller 32 sends a reading request command and an address signal. The transmission of the signals through circuit boards and output/input ports may cause a time delay. If the time delay lasts two clock periods, the DDR chip 31 correspondingly outputs the sampling data and the sampling clock signal at the time T2. The sampling clock signal with a delay of one forth period is used as the sampling clock of the asynchronous data memory 327 during factual operation. The sampling data is used as the input data of the asynchronous data memory 327. The sampling data and the sampling clock signal undergo a same delay through the circuit board and the input/output port, so the sampling clock signal after the delay of one forth period just corresponds to a middle position of one period in the wave of the sampling data signal. Thus, the requirement on time of establishment and retention of data is largely satisfied.

In the present embodiment, the external clock signal is inputted to the DDR controller 32 via the clock signal input port DCLK 321 and then outputted to the sampling clock input port 311 CK of the DDR chip 31 via the clock signal output unit PMEMIO 322 after being phase inverted. Under action of the working clock, the DDR chip 31 outputs the corresponding sampling data and the sampling clock, which are respectively transmitted to the writing data input port WDATA 327c and the writing clock input port WCLK 327a through the first input unit PMEMIO1 323 and the second input unit PMEMIO2 324, and function as the writing data signal and the writing clock of the asynchronous data memory 327. The signal inputted by the writing control signal input port WINC 327b of the asynchronous data memory 327 is valid all the time in the present embodiment. However, the writing clock signal together with the sampling data is inputted to the DDR controller 32 only when the sampling data of the DDR chip 31 is valid. Thus, each sampling data entering into the asynchronous data memory 327 should be stored into the internal memory by the asynchronous data memory 327. The count value of the writing operation counter increases by one after the internal memory stores new data. Because neither the writing operation nor the reading operation is executed at the beginning of the data sampling, the count values of the writing operation counter and the reading operation counter are equal. After the writing operation happens once, the count value of the writing operation counter is not equal to that of the reading operation counter. The signal outputted by the internal memory state output port REMPTY 327h may be switched from 1 to 0. Because the reading control signal is obtained by inverting the signal inputted by the internal memory state output port REMPTY 327h, the reading control signal is switched from 0 to 1 and work in coordination with the reading clock signal to control the reading data output port RDATA 327g to read the new stored sampling data from the internal memory. The new stored sampling data is outputted to the reading data output port Read Data 326 and then outputted to external of the DDR controller 32 by the reading data output port Read Data 326. By this time the reading operation also has happened once, and the count value of the reading operation counter is added by one. Thus, the count value of the reading operation counter is equal to that of the writing operation counter again. The signal outputted by the internal memory state output port REMPTY is switched from 0 to 1. As such, a data sampling process is properly and completely executed. The above data sampling process proceeds circularly to finish the data sampling.

During the working process of the device, when the internal memory of the asynchronous data memory 327 has new data stored therein, the output port should be activated to output the sampling data to the external of the DDR controller 32. The writing clock of the asynchronous data memory 327 depends on the data sampling clock outputted by the DDR chip. The reading clock correlates with the clock of DDR controller 32. The writing clock and the reading clock do not correlate with each other. The processes storing new sampling data and reading the sampling data in the internal memory of the asynchronous data memory 327 are mutually independent. The phase relationship of the clocks is negligible. The delay in the operation of the present embodiment is not sensitive, which differ from the delay in the conventional process, although the delay is the main reason that causes a phase difference of the clocks. A tolerable delay bound of the signals may comparatively large. Thus, the present device can properly finish the data sampling process in time under a temperature variation or an electromagnetic interference.

The designs of a data sampling device controller have been described above. The principle and realization of the invention have been described by way of examples, which are only presented to facilitate understanding of the methodology and the substance of the invention. Numerous changes in the embodiments and the application areas can be made by those skilled in the art according to the substance of the invention. Accordingly, the foregoing description of embodiments should not be considered as definition of the scope of the present invention.

What is claimed is:

1. A sampling controller coupled to a memory chip, the memory chip having a data output port and a sampling clock output port, the sampling controller comprising:
    a first input unit receiving a sampling data from the data output port of the memory chip;
    a second input unit receiving a clock signal from the sampling clock output port of the memory chip; and
    an asynchronous data memory including a memory data writing port, a memory data reading port, and an internal memory, the memory data writing port receiving the clock signal and employing the clock signal as a writing clock signal to store the sampling data of the first input unit into the internal memory, wherein when the sampling data is stored to the internal memory, the memory data reading port reads the sampling data from the internal memory.

2. The sampling controller as claimed in claim 1, wherein the internal memory outputs a control signal when the internal memory has new sampling data stored therein, the control signal activating the memory data reading port to read the sampling data from the internal memory.

3. The sampling controller as claimed in claim 1, wherein the memory data writing port includes:
    a writing clock input port receiving a clock signal from the second input unit and employing the clock signal as a writing clock;

a writing control input port receiving a writing control signal;

a writing data input port storing the sampling data of the first input unit into the internal memory according to the writing clock and the writing control signal.

4. The sampling controller as claimed in claim 3, wherein the memory data reading port includes:

a reading clock input port receiving a reading clock signal;

a reading control input port receiving a reading control signal; and a reading data output port reading the sampling data from the internal memory according to the reading clock signal and the reading control signal when the internal memory has new sampling data stored therein.

5. The sampling controller as claimed in claim 4, wherein the writing data input port includes a writing operation counter, a count value of the writing operation counter increases by one when the sampling data is stored to the internal memory; the reading data output port includes a reading operation counter, a count value of the reading operation counter increases by one when the reading data output port reads the sampling data from the internal memory;

the memory data reading port further including an internal memory state output port for output a state signal denoting that the internal memory stores new sampling data when the counter value of the writing operation counter is not equal to that of the reading operation counter, wherein the state signal functions as a reading control signal after being inverted to activate the reading data output port to read the sampling data from the internal memory.

6. The sampling controller as claimed in claim 4, wherein the sampling controller further includes a clock signal input port, which receives an external clock signal used as a working clock of the sampling controller.

7. The sampling controller as claimed in claim 6, wherein the reading clock input port employs the working clock of the sampling controller as a reading clock.

8. The sampling controller as claimed in claim 3, wherein the writing control signal is always held in a high level.

9. The sampling controller as claimed in claim 8, further comprising a plurality of internal memories.

10. The sampling controller as claimed in claim 3, wherein the asynchronous data memory is an asynchronous FIFO memory.

11. A sampling controller for reading sampling data from a memory chip, the sampling controller comprising:

a first input unit receiving a sampling data from the memory chip;

a second input unit receiving a clock signal from the memory chip; and an asynchronous data memory including a memory data writing port, a memory data reading port, and an internal memory; the memory data writing port receiving the clock signal and employing the clock signal as a writing clock signal to store the sampling data of the first input unit into the internal memory; when the sampling data is stored to the internal memory, the memory data reading port reads the sampling data from the internal memory.

12. The sampling controller as claimed in claim 11, wherein the memory data writing port includes:

a writing clock input port receiving a clock signal from the second input unit and employing the clock signal as a writing clock;

a writing control input port receiving a writing control signal; and a writing data input port storing the sampling data of the first input unit into the internal memory according to the writing clock and the writing control signal.

13. The sampling controller as claimed in claim 12, wherein the memory data reading port includes:

a reading clock input port receiving a reading clock signal;

a reading control input port receiving a reading control signal; and a reading data output port reading the sampling data from the internal memory according to the reading clock signal and the reading control signal when the internal memory has new sampling data stored therein.

14. The sampling controller as claimed in claim 13, wherein the writing data input port includes a writing operation counter, a count value of the writing operation counter is increased by one when the sampling data is stored to the internal memory, the reading data output port includes a reading operation counter, a count value of the reading operation counter is increased by one when the reading data output port reads the sampling data from the internal memory;

the memory data reading port further including an internal memory state output port for output a state signal denoting that the internal memory stores new sampling data when the counter value of the writing operation counter is not equal to that of the reading operation counter, wherein the state signal functions as a reading control signal after being inverted to activate the reading data output port to read the sampling data from the internal memory.

15. The sampling controller as claimed in claim 13, wherein the sampling controller further includes a clock signal input port, which receives an external clock signal used as a working clock of the sampling controller.

16. The sampling controller as claimed in claim 15, wherein the reading clock input port employs the working clock of the sampling controller as a reading clock.

17. The sampling controller as claimed in claim 16, further comprising a plurality of internal memories.

18. The sampling controller as claimed in claim 11, wherein the asynchronous data memory an asynchronous FIFO memory.

* * * * *